US010837453B2

(12) United States Patent
Tsorng et al.

(10) Patent No.: US 10,837,453 B2
(45) Date of Patent: Nov. 17, 2020

(54) FAN MODULE WITH LOCKABLE LENS

(71) Applicant: QUANTA COMPUTER INC., Taoyuan (TW)

(72) Inventors: Yaw-Tzorng Tsorng, Taoyuan (TW); Chun Chang, Taoyuan (TW); Hsin-Chieh Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 197 days.

(21) Appl. No.: 16/138,210

(22) Filed: Sep. 21, 2018

(65) Prior Publication Data
US 2020/0096003 A1 Mar. 26, 2020

(51) Int. Cl.
*F04D 29/00* (2006.01)
*F04D 29/40* (2006.01)
*F04D 29/70* (2006.01)

(52) U.S. Cl.
CPC ......... *F04D 29/005* (2013.01); *F04D 29/403* (2013.01); *F04D 29/703* (2013.01)

(58) Field of Classification Search
None
See application file for complete search history.

(56) References Cited

U.S. PATENT DOCUMENTS

| 5,481,440 A | 1/1996 | Oldham et al. |
| 6,045,249 A | 4/2000 | Bellinghausen et al. |
| 9,253,927 B1 * | 2/2016 | Kull .................. H05K 7/20581 |
| 2003/0026074 A1 | 2/2003 | Clements et al. |
| 2015/0185072 A1 | 7/2015 | Huang et al. |
| 2016/0157380 A1 | 6/2016 | Kull et al. |

FOREIGN PATENT DOCUMENTS

JP 2014235787 A 12/2014

OTHER PUBLICATIONS

Extended European Search Report for EP Application No. 19164361.8, dated Oct. 25, 2019.

\* cited by examiner

*Primary Examiner* — Britt D Hanley
(74) *Attorney, Agent, or Firm* — Nixon Peabody LLP

(57) ABSTRACT

An apparatus includes a fan module and an elongated lens. The fan module includes a housing and a cover plate having a plurality of apertures. The elongated lens includes a head portion that extends through one of the apertures of the cover plate. The head portion has a first dimension and a second dimension. The aperture also has a first dimension and a second dimension. The first dimension of the head portion is less than the first dimension of the aperture and is greater than the second dimension of the aperture. When the first dimension of the head portion is aligned with the first dimension of the aperture, the aperture permits the head portion to pass through the aperture. When the first dimension of the head portion is aligned with the second dimension of the aperture, the aperture prevents the head portion from passing through the aperture.

20 Claims, 17 Drawing Sheets

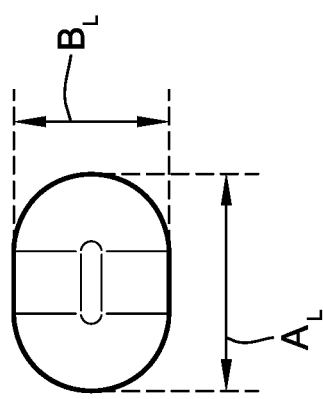
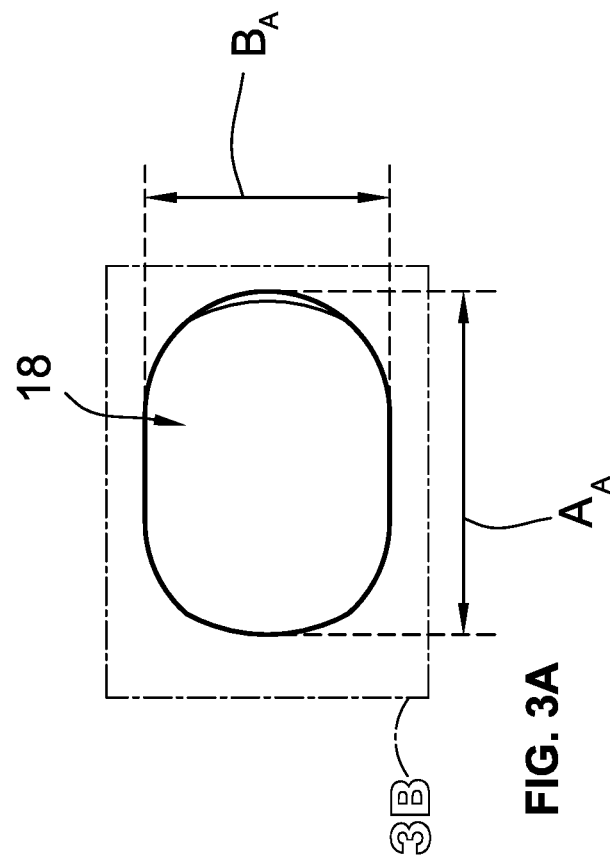
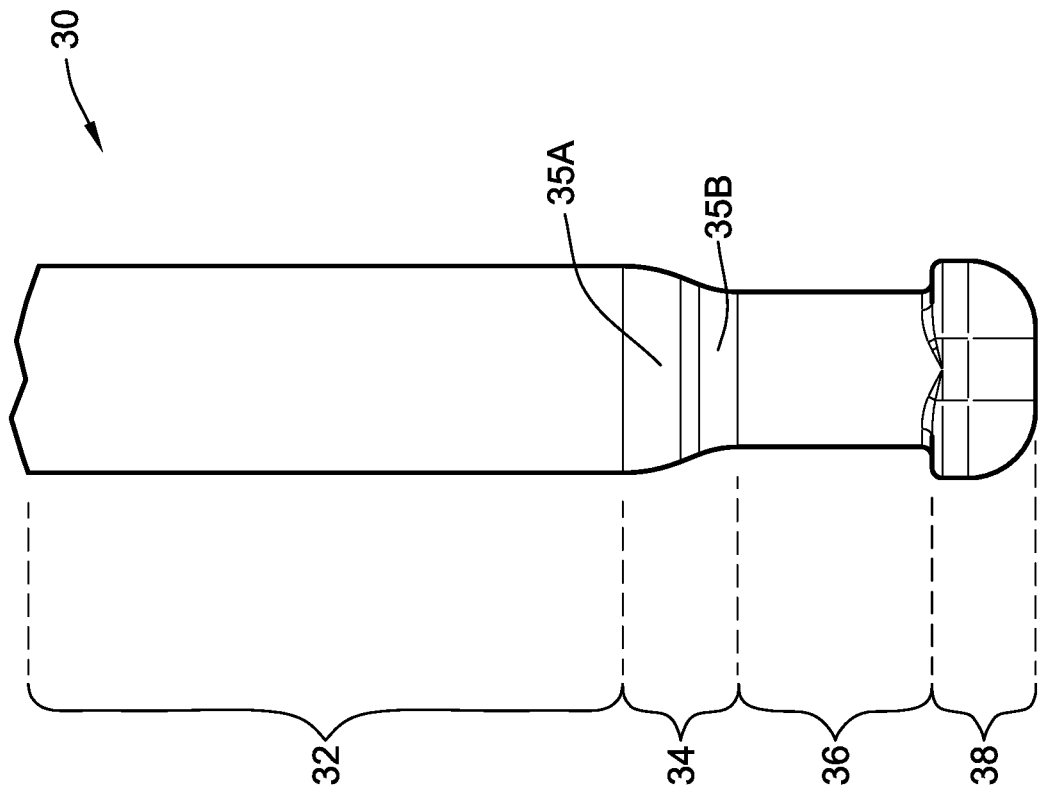

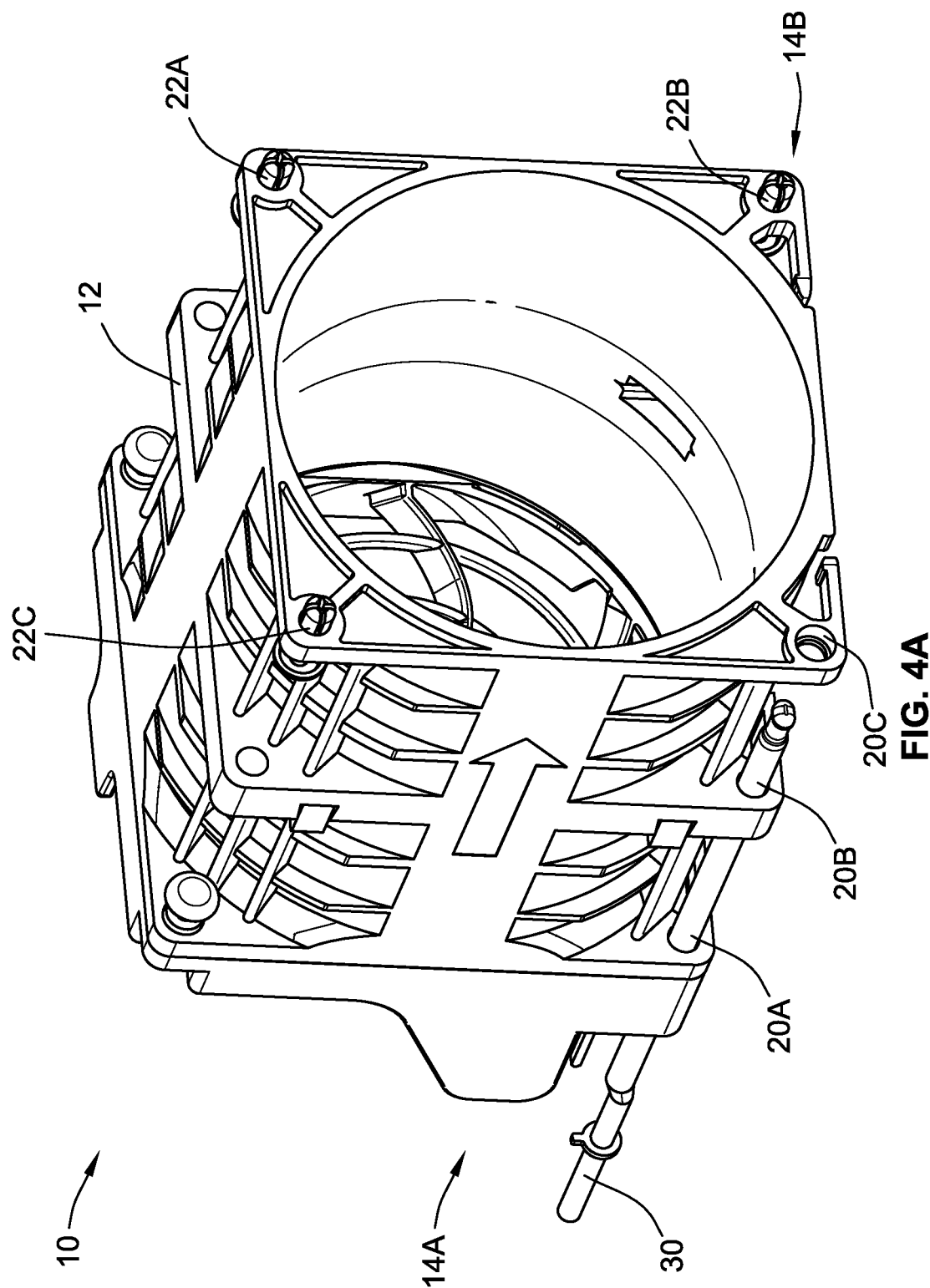

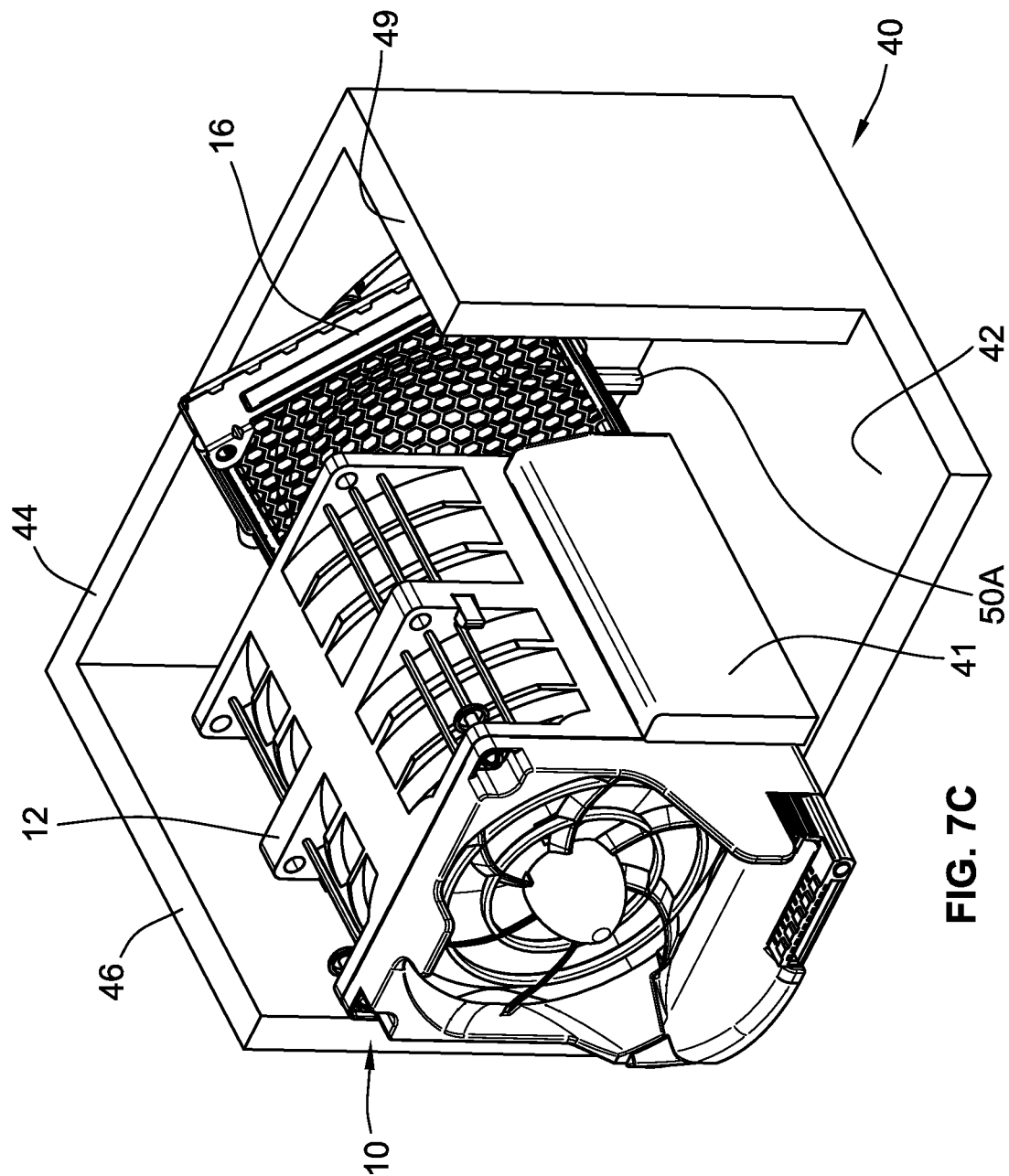

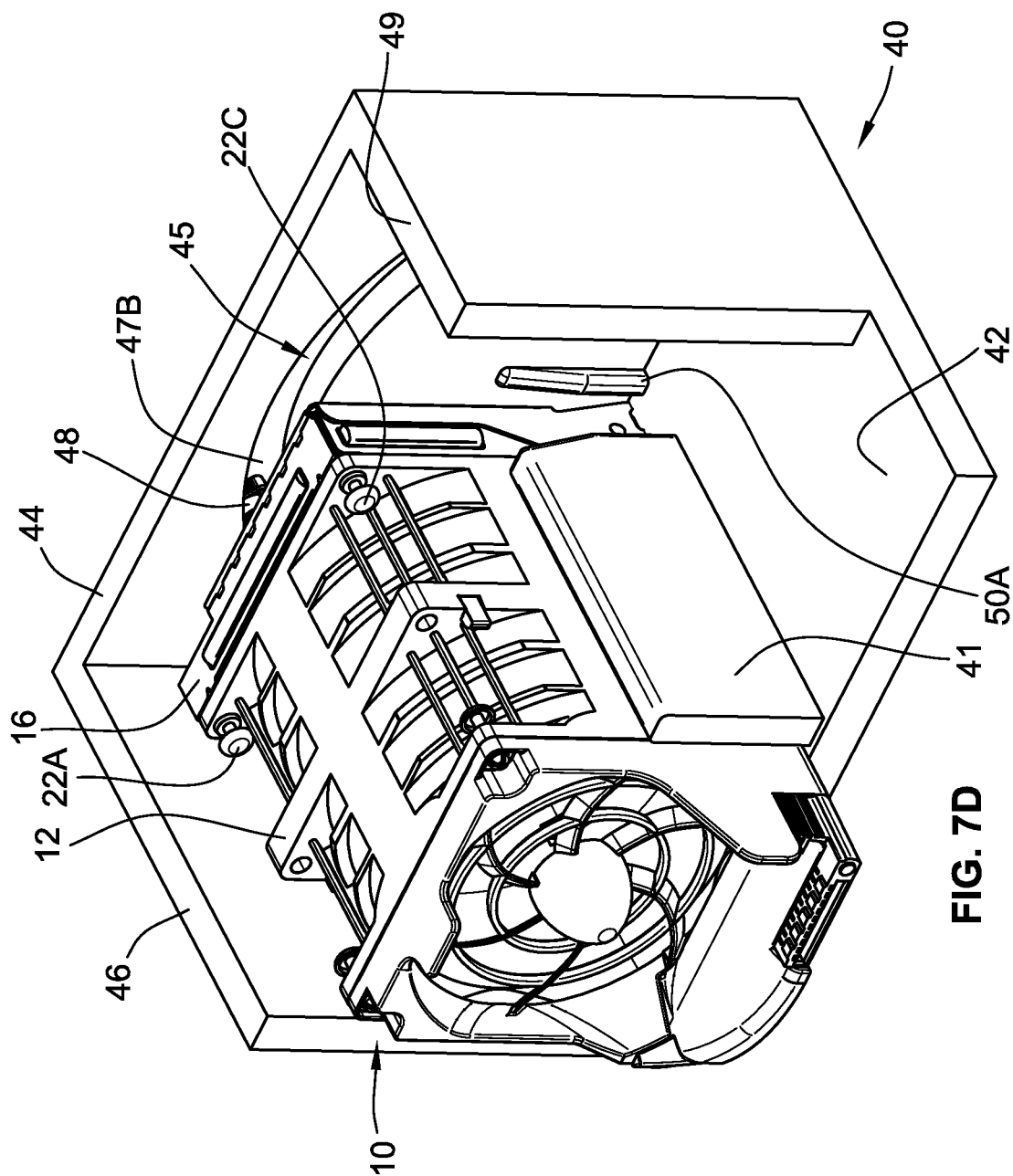

FAN MODULE WITH LOCKABLE LENS

TECHNICAL FIELD

The present disclosure relates generally to fan modules with lenses for focusing light, and more particularly, to a lens that can be secured to a fan module.

BACKGROUND

Components used in electronic devices or computing systems can generate large amounts of heat during operation. In such devices and systems, a fan module can be used to generate air flow to help carry away the generated heat. In certain configurations, a light-emitting component can be included in these devices or systems to communicate a status of the fan module to a technician. However, because of space limitations, the fan module may be need to be placed between the light-emitting component and an area of the device or system visible to the technician. In these situations, an elongated lens can be used to transmit the emitted light to a more convenient viewing location. Specifically, the elongated lens can be integrated into the fan module. However, typical methods for integrating an elongated lens into a fan module have a high risk of damaging the elongated lens and degrading performance. For example, an elongated lens is typically secured within a fan module using screw-on lens caps. Such lens caps not only reduce the intensity of the transmitted light, but can cause fracture of the elongated lens during assembly. The present disclosure is directed to solving these and other problems.

SUMMARY

According to aspects of the present disclosure, a fan module with an integrated elongated lens is provided. The fan module includes a housing in which a fan may be disposed, and a cover plate that partially covers an opening in the housing. An elongated lens can be used to direct and focus light emitted by a light-emitting device. The elongated lens can be inserted through lens mount apertures in the housing of the fan module.

The cover plate forms a grid that has a plurality of apertures, and is located at an end of the fan module opposite the light-emitting device. The elongated lens can be configured to extend through one of the apertures in the cover plate. A head portion of the elongated lens and at least one of the apertures in the cover plate are dimensioned to selectively pass through the aperture. When the cover plate is in a first orientation relative to the head portion, the head portion can pass through the aperture. When the cover plate is in a second orientation relative to the cover plate, the head portion is prevented from passing through the aperture.

The head portion of the elongated lens has an oblong shape with a first dimension and a second dimension. The aperture in the cover plate through which the head portion passes has a corresponding oblong shape with a first dimension and a second dimension. Generally, the first dimension of the head portion is less than the first dimension of the aperture but greater than the second dimension. The second dimension of the head portion is less than both the first dimension and the second dimension of the aperture.

When the cover plate is in the first orientation relative to the head portion, the first dimension of the head portion is aligned with the first dimension of the aperture. Because the first dimension of the head portion is less than the first dimension of the aperture, the head portion can pass through the aperture. The cover plate can then be rotated about 90 degrees to the second orientation. In the second orientation, the first dimension of the head portion is aligned with the second dimension of the aperture. Because the first dimension of the head portion is greater than the second dimension of the aperture, the head portion cannot pass back through the aperture. By rotating the cover plate from a first orientation to a second orientation relative to the head portion of the elongated lens, the head portion is secured to the cover plate and is locked in place.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

FIG. 2A is a cross-sectional view of the elongated lens of FIG. 1B along section A, according to some aspects of the present disclosure;

FIG. 2B is an end elevation view of a head portion of the elongated lens of FIG. 1B, according to some aspects of the present disclosure;

FIG. 3A is an end elevation view of an aperture in a cover plate of the fan module of FIG. 1A, according to some aspects of the present disclosure;

FIG. 4A is a perspective view of a first end of the fan module of FIG. 1A illustrating initial insertion of the elongated lens of FIG. 1B, according to some aspects of the present disclosure;

FIG. 7C is a perspective view of the cover plate of the fan module of FIG. 1A being rotated from the first orientation to a second orientation, according to some aspects of the present disclosure; and FIG. 7D is a perspective view of the cover plate of the fan module of FIG. 1A being positioned in the second orientation, according to some aspects of the present disclosure.

Figure 1A:
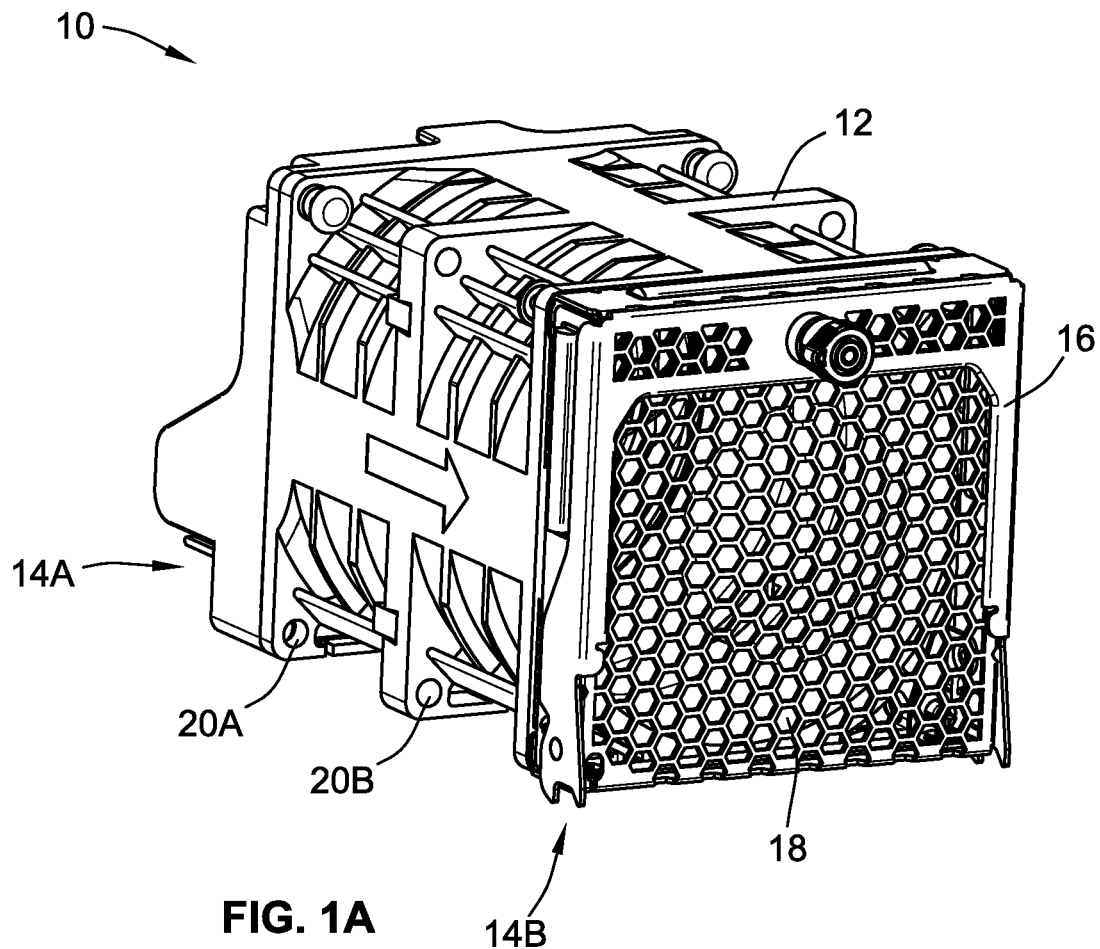
FIG. 1A is a perspective view of a fan module according to some aspects of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

As noted above it, is challenging to integrate elongated lenses into fan modules. The present disclosure provides new designs for fan modules with integrated elongated lens, which address the limitations of conventional designs. In particular, the fan module and the elongated lens are configured such that a head portion of the elongated lens can selectively pass through an aperture in a cover plate of the fan module. The aperture in the cover plate has an oblong shape with a first dimension and a second dimension. Similarly, the head portion of the elongated lens also has an oblong shape with a first dimension and a second dimension, where the first dimension of the head portion is less than the first dimension of the aperture but greater than the second dimension. During assembly of the fan module, the cover plate can be rotated relative to the head portion of the elongated lens. This action locks the head portion of the elongated lens in place within the fan module. In this way, the elongated lens is secured within the fan module without the need for lens caps, thereby reducing the risk of fractures and improving light transmission.

Figure 1B:
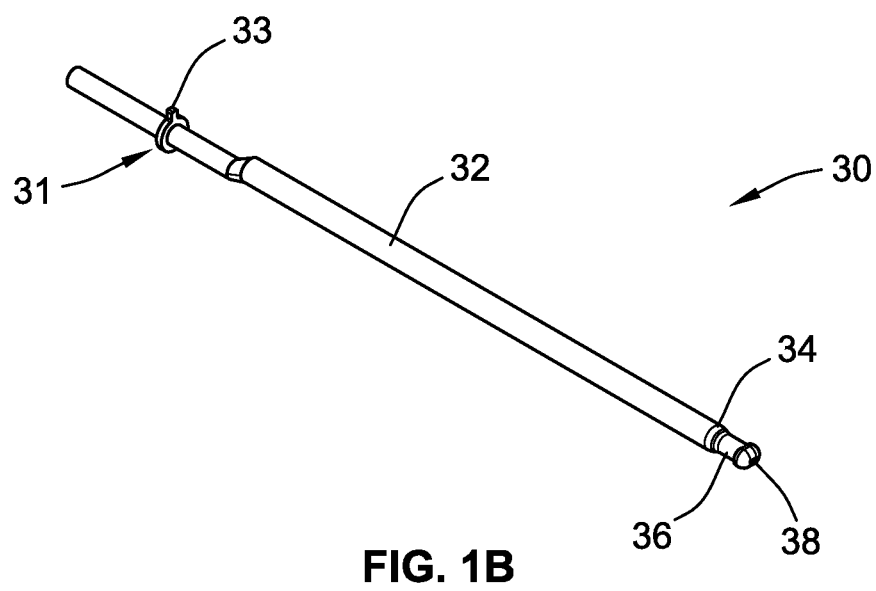
FIG. 1B is a perspective view of an elongated lens for use with the fan module of FIG. 1A, according to some aspects of the present disclosure.

FIG. 1A shows an implementation of a fan module 10 according to the present disclosure. FIG. 1B shows an implementation of an elongated lens 30 for use with the fan module 10 of FIG. 1A. As shown in FIG. 1A, the fan module 10 includes a housing 12 within which the fan (not shown) may be placed. The housing 12 includes a first end 14A and a second end 14B. The first end 14A of the housing 12 is positioned next to the light-emitting component (not shown). Such a light-emitting component can be integrated into a connector (not shown) or a connector board (not shown) for providing power and, optionally, control signals to the fan module 10.

A removable cover plate 16 is coupled to the second end 14B of the housing 12 to protect the fan during use. In the exemplary configuration of FIG. 1A, the cover plate 16 generally forms a grid that includes a plurality of apertures 18. However, the present disclosure contemplates that any other arrangement of apertures 18 can be used. The apertures 18 allow air to flow through the housing 12. The housing 12 also includes one or more lens mount apertures 20A and 20B. The lens mount apertures 20A, 20B are sized to receive the elongated lens 30 and hold the elongated lens 30 within the housing 12. When the elongated lens 30 is integrated into the housing 12, at least a portion of the elongated lens 30 is disposed within the lens mount apertures 20A, 20B.

In FIG. 1B, the elongated lens 30 generally includes a body portion 32, a transition region 34, a neck portion 36, and a head portion 38. The transition region 34 is positioned between the body portion 32 and the neck portion 36. The neck portion 36 is positioned between the transition region 34 and the head portion 38. Each of these portions is sized so that the portions fit through the lens mount apertures 20A, 20B. Once the elongated lens 30 is integrated into the fan module 10, at least the head portion 38 is configured to extend past the second end 14B. The head portion 38 can then pass through one of the apertures 18 of the cover plate 16. The elongated lens 30 thus transmits emitted light from the first end 14A to the second end 14B.

The elongated lens 30 can also have a rotation-locking feature 31. The rotation-locking feature 31 is configured prevent the elongated lens 30 from rotating relative to the housing 12 once the elongated lens 30 is integrated into the housing 12. In some implementations, the rotation-locking feature 31 includes a radially-extending projection 33. When the elongated lens 30 is integrated into the housing 12, the radially-extending projection 33 of the rotation-locking feature 31 is positioned within a slot or aperture defined by the housing 12, which prevents rotation of the elongated lens 30.

FIG. 2A and FIG. 2B show details of the structure of the elongated lens 30. Both the body portion 32 and the neck portion 36 are generally circular. The diameter of the body portion 32 is generally larger than the diameter of the neck portion 36. The diameter of the transition region 34 decreases between the body portion 32 and the neck portion 36.

A first end 35A of the transition region 34 is adjacent to the body portion 32. At the first end 35A, the diameter of the transition region 34 is generally equal to the diameter of the body portion 32. A second end 35B of the transition region 34 is adjacent to the neck portion 36. At the second end 35B, the diameter of the transition region 34 is generally equal to the diameter of the neck portion 36. Between these two ends 35A, 35B, the diameter of the transition region 34 decreases from the diameter of the body portion 32 to the diameter of the neck portion 36. This decrease can be linear or non-linear. The decrease can also be provided in a stepped fashion.

The head portion 38 of the elongated lens 30 generally has an oblong shape with at least two different dimensions. As shown in FIG. 2B, the head portion 38 can have a generally oval shape with a larger dimension $A_L$ and a smaller dimension $B_L$. Dimension $A_L$ of the head portion 38 can be the same or different than the diameter of the body portion 32. Similarly, dimension $B_L$ of the head portion 38 can be the same or different than the diameter of the neck portion 36. These different dimensions can be leveraged to lock the elongated lens 30 in place as described below in FIGS. 3A-3C.

Figure 3B:
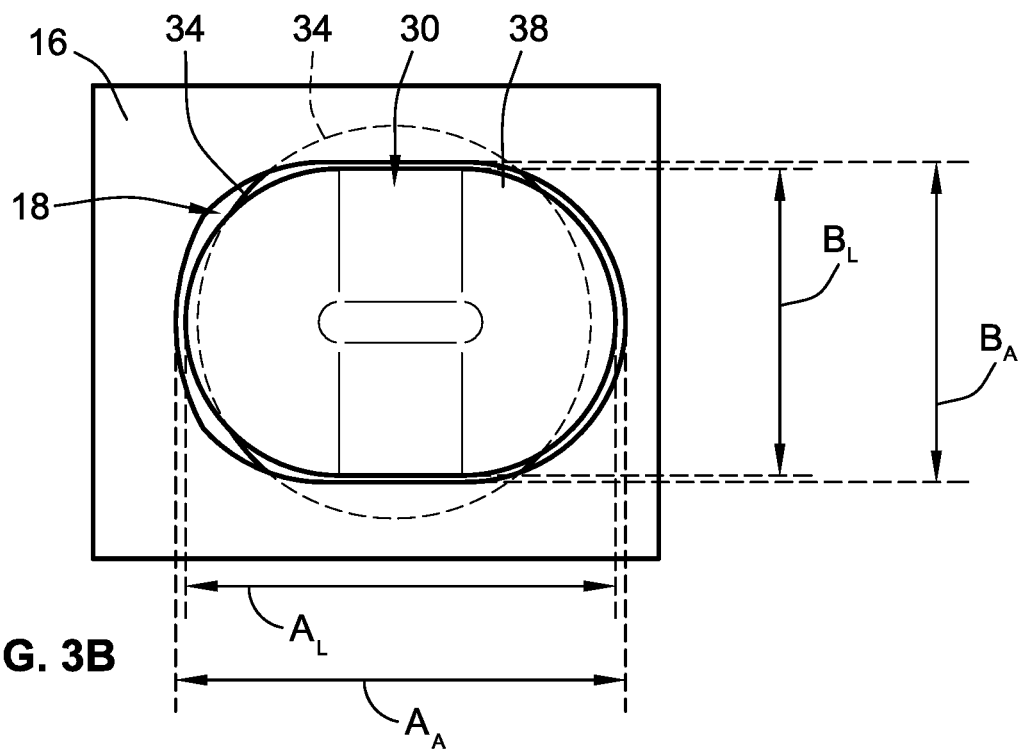
FIG. 3B is an end elevation view of the aperture of FIG. 3A in a first orientation relative to the head portion of the elongated lens of FIG. 1B, according to some aspects of the present disclosure.

As shown in FIG. 3A, at least one of the apertures 18 in the cover plate 16 has an oblong shape. This oblong shape of the aperture 18 generally corresponds to the oblong shape of the head portion 38 of the elongated lens. That is, the aperture 18 has a larger dimension AA and a smaller dimension BA that are larger than $A_L$ and $B_L$, respectively. During assembly, as shown in FIG. 3B, dimension $A_L$ of the head portion 38 is aligned with dimension AA of the aperture 18. Thus, the head portion 38 is able to pass through the aperture 18.

Figure 3C:
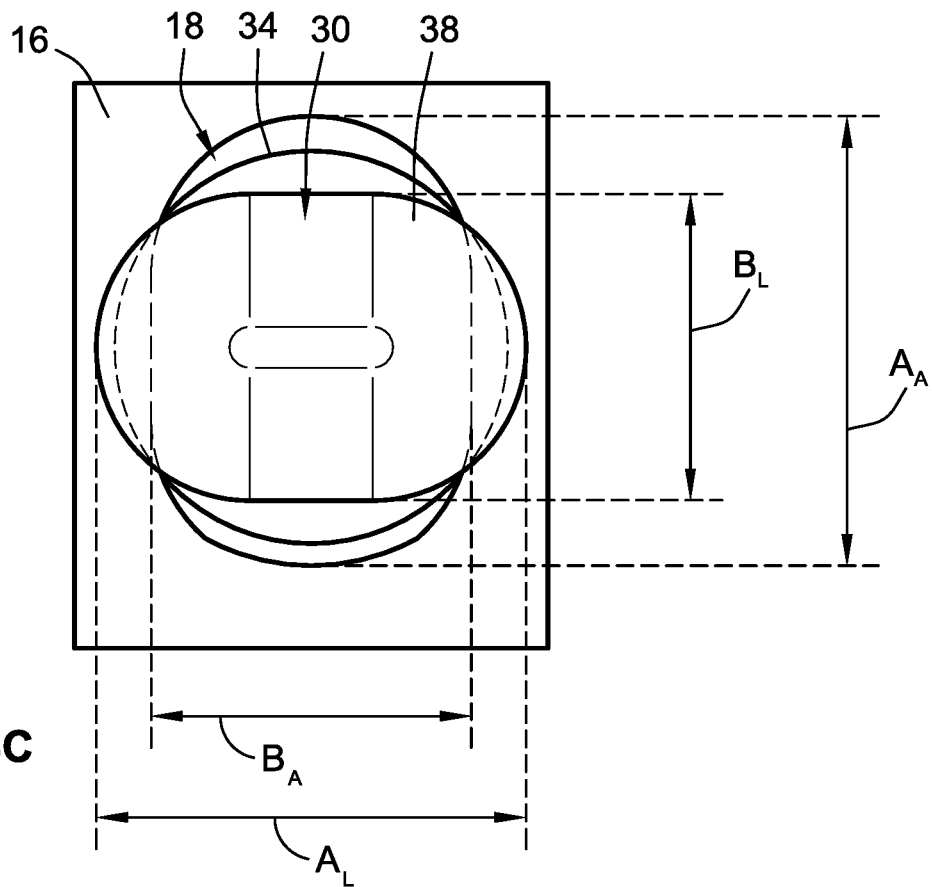
FIG. 3C is an end elevation view of the aperture of FIG. 3A in a second orientation relative to the head portion of the elongated lens of FIG. 1B, according to some aspects of the present disclosure.

To lock the elongated lens in place, the cover plate 16 can be rotated relative to the elongated lens 30. For example, as shown in FIG. 3C, the cover plate 16 can be rotated 90 degrees. The result is that dimension $A_L$ of the head portion 38 is aligned with dimension BA of the aperture 18. Thus, the head portion 38 cannot pass back through the aperture 18 because dimension $A_L$ is larger than dimension BA. Further, by configuring at least a portion of the transition region 34 to have a dimension larger than dimension BA, further motion of the elongated lens 30 through the aperture 18 is prevented as well. In some implementations, dimension $A_L$ can be between about 2 millimeters and about 4 millimeters, or about 3 millimeters. Dimension $B_L$ can be between about 3 millimeters and about 5 millimeters, or about 4.2 millimeters. In some implementations, a ratio of dimension $A_L$ to dimension $B_L$ can be about 4.2:3.

Figure 4B:
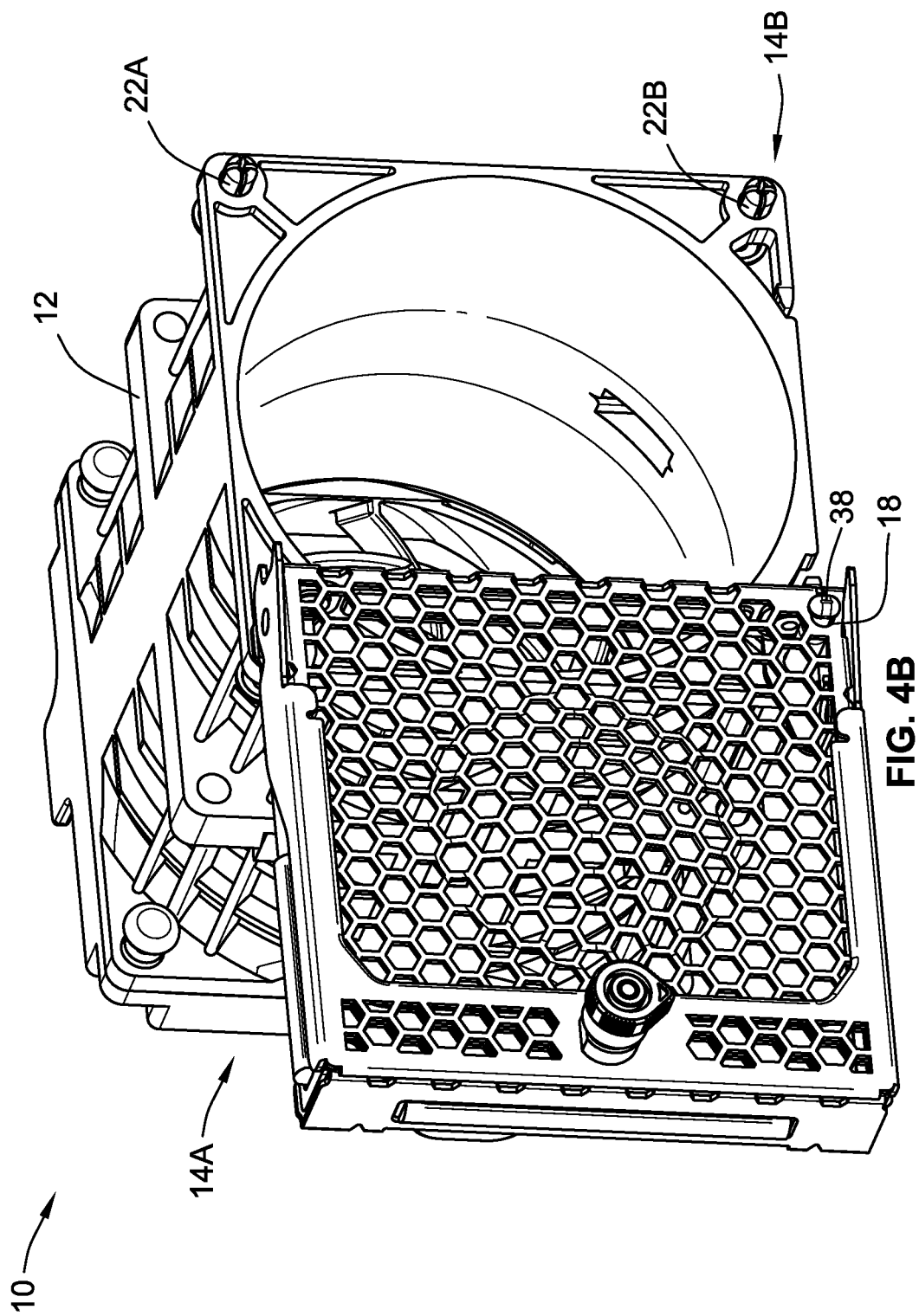
FIG. 4B is a perspective view of the first end of the fan module of FIG. 1A with the cover plate in a first orientation relative to the head portion of the elongated lens of FIG. 1B, according to some aspects of the present disclosure.
Figure 4C:
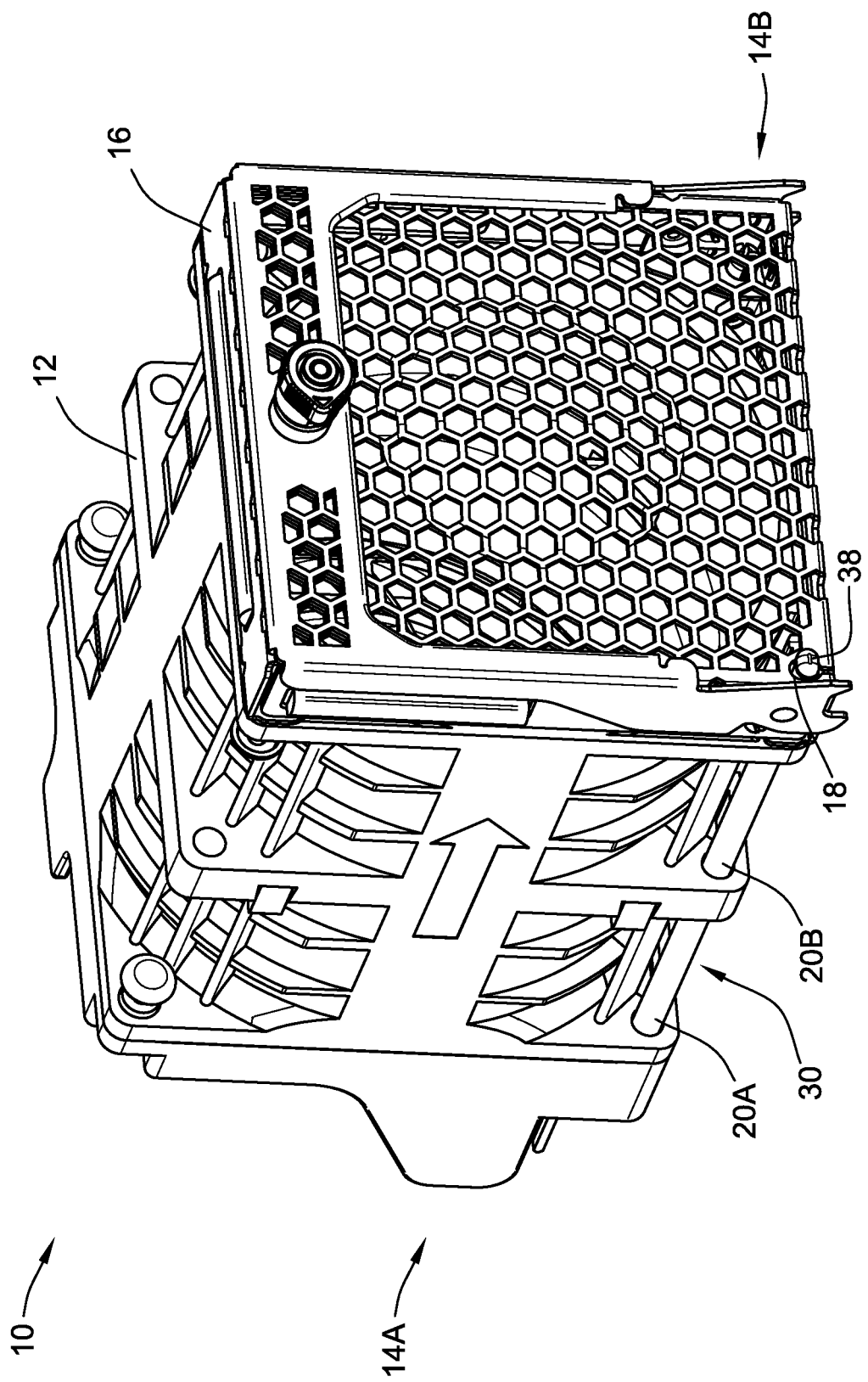
FIG. 4C is a perspective view of the first end of the fan module of FIG. 1A with the cover plate in a second orientation relative to the head portion of the elongated lens of FIG. 1B, according to some aspects of the present disclosure.

FIGS. 4A-4C illustrate in more detail the integration of the elongated lens 30 into the housing 12 when viewing the second end 14B of the housing 12. Initially, as shown in FIG. 4A, the cover plate 16 is not attached to the housing 12. The elongated lens 30 is inserted into the housing 12 so as to pass through the lens mount apertures 20A and 20B. Thereafter, as shown in FIG. 4B, the elongated lens 30 is inserted further into the housing 12 so as to also pass through lens mount aperture 20C, and the cover plate 16 is positioned in a first orientation relative to the head portion 38. When the cover plate 16 is positioned in this first orientation, the large dimension of the head portion 38 is aligned with the large dimension of the aperture 18. The head portion 38 can thus pass through the aperture 18, similar to the configuration illustrated in FIG. 3B.

In some implementations, the elongated lens 30 is first inserted through the lens mount apertures 20A and 20B. The cover plate 16 can subsequently be positioned adjacent to the housing 12 so that the elongated lens 30 is inserted into the aperture 18. In other implementations, the cover plate 16 can initially be positioned adjacent to the housing 12, and the elongated lens 30 can then be inserted through the lens mount apertures 20A, 20B and the aperture 18.

FIG. 4A also illustrates fasteners 22A, 22B, and 22C that can be inserted through fastener apertures in the housing 12. FIG. 4B illustrates fasteners 22C and 22B. Fastener 22C is not visible in FIG. 4B as the cover plate 16 is positioned in front of fastener 22C. The fasteners 22A-22C are configured to extend through the fastener apertures in the housing 12 and through fastener apertures in the cover plate 16 to secure the cover plate 16 to the housing 12. Any number of fasteners can be used. For example, when the housing 12 has a square or rectangular cross-section, the housing 12 may include three fastener apertures defined in the housing 12. The head portion 38 of the elongated lens 30 may be located adjacent to the fourth corner of the housing 12 when the elongated lens 30 is coupled to the housing 12. In this implementation, the cover plate 16 has three corresponding fastener apertures that align with the fastener apertures in the housing 12. The fasteners 22A-22C can then be inserted through the fastener apertures in the housing 12 and the cover plate 16. Other implementations may use any number of fasteners and fastener apertures.

In other implementations, the housing 12 may include bosses extending from the housing 12 instead of or in addition to the fasteners 22A-22C and the fastener apertures. The bosses can extend from the housing 12 in the same direction that the head portion 38 of the elongated lens 30 extends through the aperture 18. The bosses can be used to secure the cover plate 16 to the housing 12 by mating with corresponding depressions or shafts (not shown) that are defined in the cover plate 16.

Once the elongated lens 30 has been inserted through the housing 12 and the aperture 18, the cover plate 16 can be rotated about 90 degrees to a second orientation relative to the head portion 38, as illustrated in FIG. 4C. In this orientation, the large dimension of the head portion 38 is aligned with the small dimension of the aperture 18. Because of this, the elongated lens 30 cannot be pulled back through the aperture 18. This second orientation of the cover plate 16 in FIG. 4C is the same as the orientation of the cover plate 16 in FIG. 3C. Thus, the elongated lens 30 can be locked into place with the head portion 38 extending out of the aperture 18.

After rotating the cover plate 16 to the second orientation, the fasteners 22A-22C can be inserted through the apertures in the housing 12 and the cover plate 16 to secure the cover plate 16 to the housing 12. The fasteners 22A-22C thus aid in preventing rotation of the cover plate 16 relative to the housing 12 once the fan module 10 and the elongated lens 30 are assembled. In other implementations, the cover plate 16 can be pressed into place such that the bosses of the housing 12 extend into the corresponding depressions or shafts of the cover plate 16. Once the cover plate 16 is secured to the housing 12, the fan module 10 can be installed into a computing device.

Other shapes of the elongated lens and the apertures of the cover plate are contemplated. The head portion can generally be any type of oblong shape, as long as the head portion has one larger dimension and one smaller dimension. For example, the head could have a diamond shape, an elliptical shape, a rectangular shape, a rectilinear shape, a triangular shape, an egg shape, etc. The shape of the head portion could be a combination of multiple shapes, such as half-diamond and half-elliptical. The apertures of the cover plate can similarly have any shape so long as the aperture has: (i) a large dimension that is greater than both dimensions of the head portion, and (ii) a small dimension that is less than the large dimension of the head portion and greater than the smaller dimension of the head portion.

In some implementations, the shapes of the apertures in the cover plate need not correspond with the shape of the head portion. For example, the apertures in the cover plate may have a rectangular shape, while the head portion has an oval shape. As long as the dimensions of the head portion and the aperture satisfy the relationships discuss herein, the elongated lens will lock into place due to the relative alignment of the head portion and the cover plate. Moreover, not all apertures in the cover plate need to be designed in this manner. Rather, the cover plate only needs to have a single aperture with the required dimensions. Any aperture that the head portion of the elongated lens will not extend through during operation can have any shape or configuration.

The elongated lens can also have a variety of different relative dimensions between the body portion, the transition region, the neck portion, and the head portion. For example, the diameters of the body portion, the transition region, and the neck portion may be dictated by the dimensions of the housing, the lens mount apertures, or other structural features of the housing or the cover plate not discussed herein. Generally, the body portion, the transition region, and the neck portion can have any suitable diameter, so long as those portions of the elongated lens do not interfere with the ability of the head portion to selectively pass through one of the apertures of the cover plate. Furthermore, the body portion, the transition region, and the neck portion are not required to have a circular shape, but can generally be any desired shape.

In some implementations, the diameter of the body portion is greater than the smaller dimension of the apertures. The body portion is thus prevented from passing through the apertures in this implementation. In other implementations, the diameter of the body portion is less than or equal to the smaller diameter of the apertures. Similarly, in some implementations, the diameter of the neck portion is less than or equal to the smaller dimension of the apertures. The neck portion is thus permitted to pass through the apertures in this implementation. In other implementations, the diameter of the neck portion is greater than the dimension of the apertures. Furthermore, in some implementations, the lens is not elongated. In these implementations, the lens may have a length that is not substantially greater than the diameter of the lens.

In some implementations, the length of the entire lens can between about 100 millimeters and about 150 millimeters, between about 120 millimeters and about 140 millimeters, between about 135 and about 140 millimeters, or about 138 millimeters. The distance between the rotation-locking feature and the border between the neck portion and the head portion can be between about 100 millimeters and about 150 millimeters, between about 100 millimeters. The thickness of the rotation-locking feature in an axial direction can be less than about 5 millimeters, less than about 3 millimeters, or about 1 millimeter.

Figure 5A:
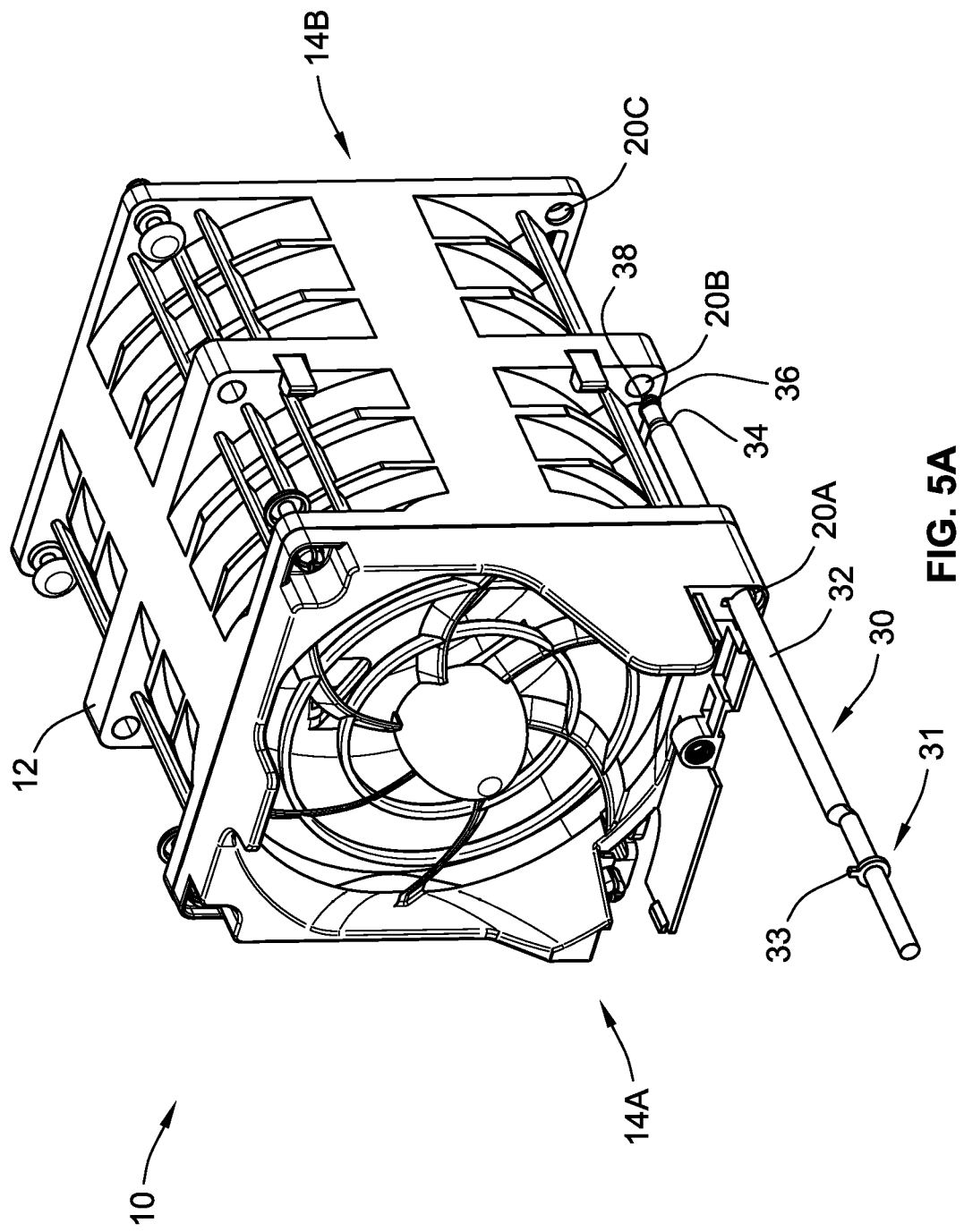
FIG. 5A is a perspective view of a second end of the fan module of FIG. 1A illustrating initial insertion of the elongated lens of FIG. 1B, according to some aspects of the present disclosure.
Figure 5B:
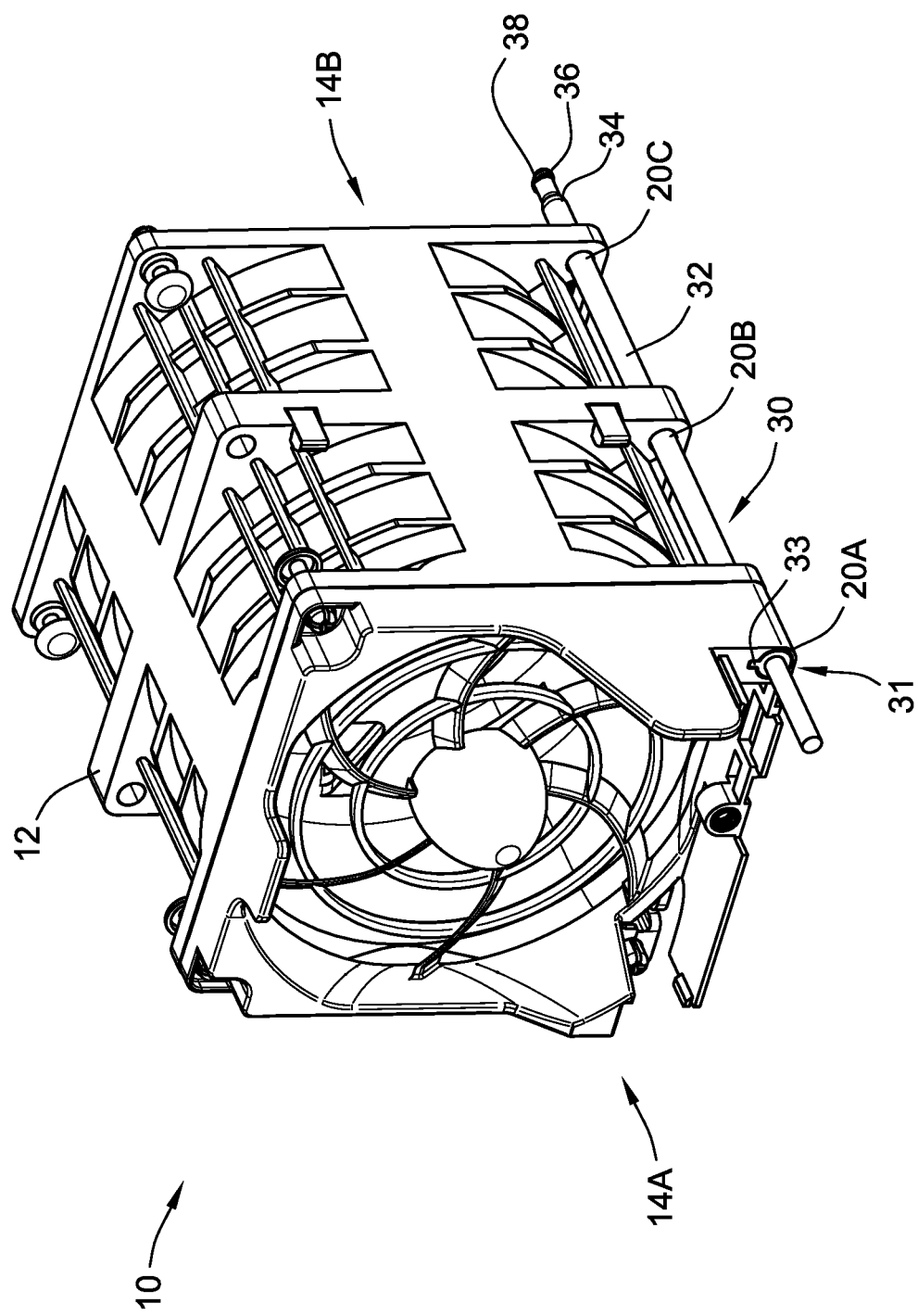
FIG. 5B is perspective view of the second end of the fan module of FIG. 1A illustrating further insertion of the elongated lens of FIG. 1B, according to some aspects of the present disclosure.

FIGS. 5A-5D illustrate in more detail the integration of the elongated lens 30 into the housing 12 when viewing the first end 14A of the housing 12. Initially, as shown in FIG. 5A, the elongated lens 30 is inserted into the housing 12 so as to pass through lens mount apertures 20A and 20B. Thereafter, as shown in FIG. 5B, the elongated lens is inserted further into the housing 12 so as to also pass through lens mount aperture 20C until the head portion 38 extends past the second end 14B of the housing 12.

Figure 5C:
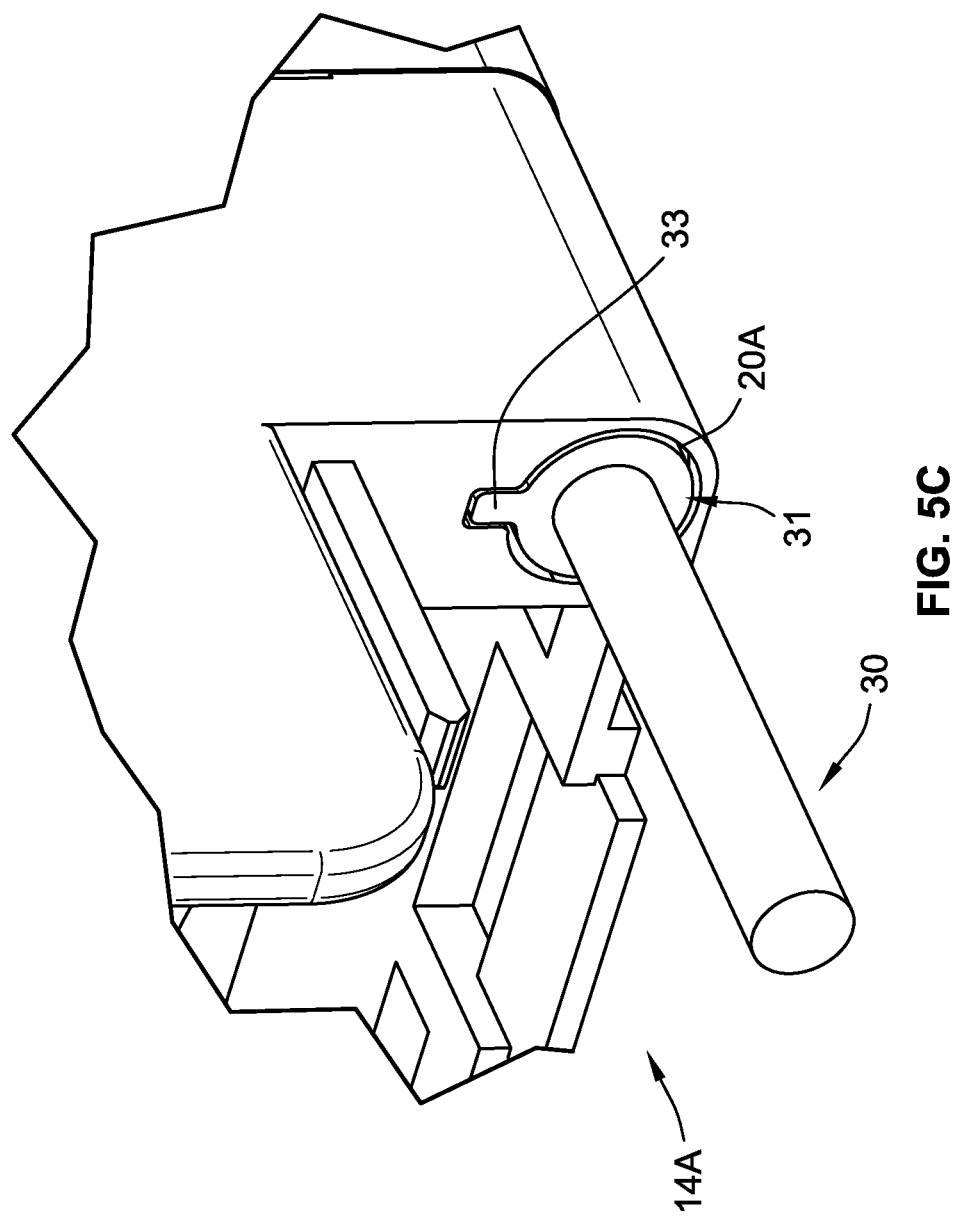
FIG. 5C is an enlarged perspective view of the elongated lens of FIG. 1B being inserted into the fan module of FIG. 1A, according to some aspects of the present disclosure.
Figure 5D:
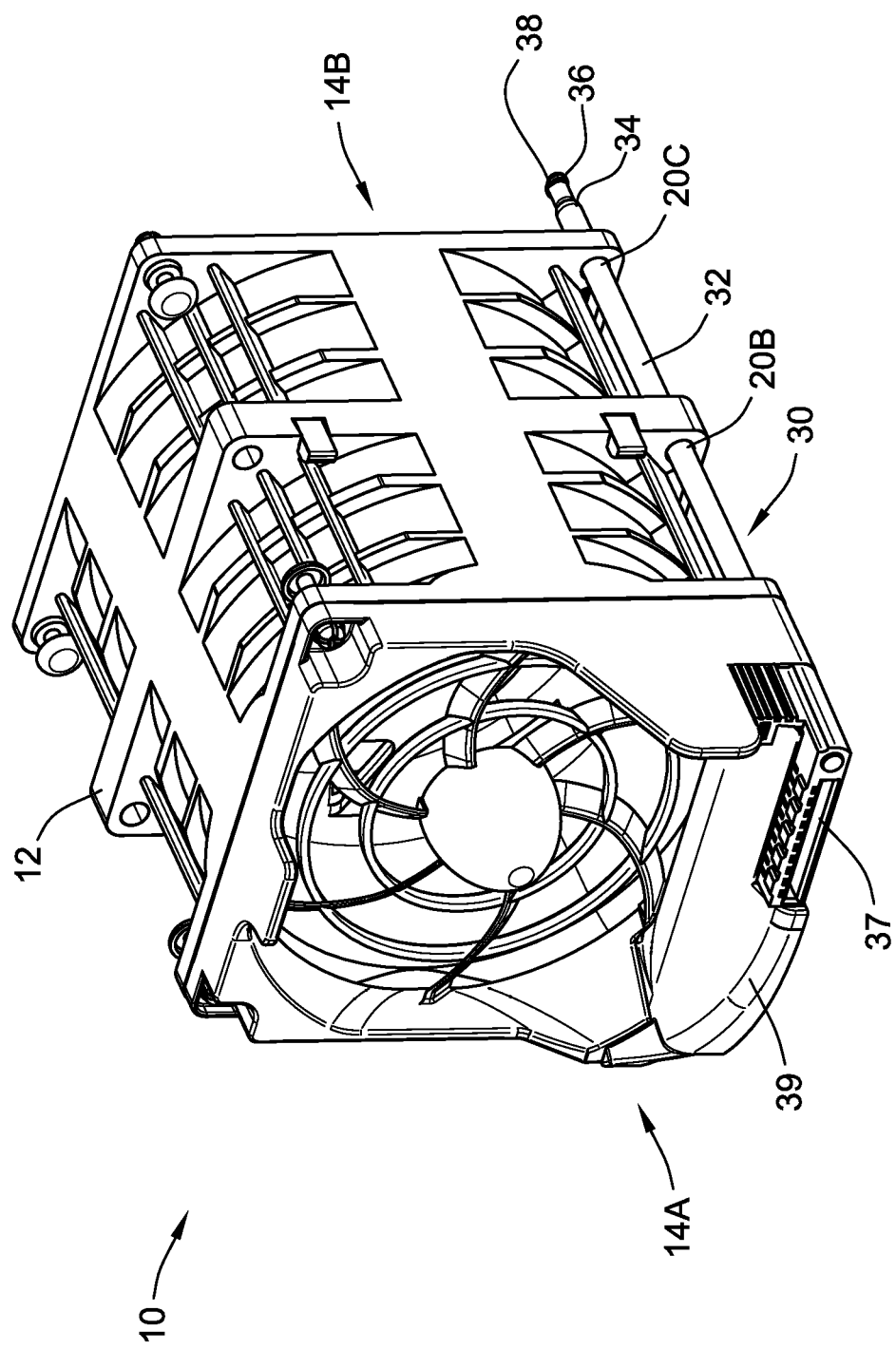
FIG. 5D is a perspective view of the second end of the fan module of FIG. 1A illustrating a fan connector and a cable cover being attached to the fan module, according to some aspects of the present disclosure.

As shown in FIG. 5C, once the elongated lens 30 is inserted fully into the housing 12, the radially-extending projection 33 of the rotation locking-locking feature 31 is positioned within a slot defined in the housing 12 above the lens mount aperture 20A. This prevents the elongated lens 30 from rotating within the lens mount apertures 20A, 20B, and 20C relative to the housing 12. In some implementations, the rotation-locking feature 31 also prevents the elongated lens 30 from passing through the lens mount apertures 20A, 20B, and 20C any further. Finally, as shown in FIG. 5D, other components, such as a fan connector 37 or a cable cover 39 can be coupled to the housing 12. The portion of the elongated lens 30 extending from lens mount aperture 20A toward the first end 14A of the housing can be inserted into these other components so as to lock the elongated lens 30 into place from the first end 14A of the housing 12. The fan connector 37 can be used control the operation of the fan, and produce the light that is transmitted using the elongated lens 30. The cable cover 39 can be used to route any cables or wires necessary for the operation of the fan.

Figure 6A:
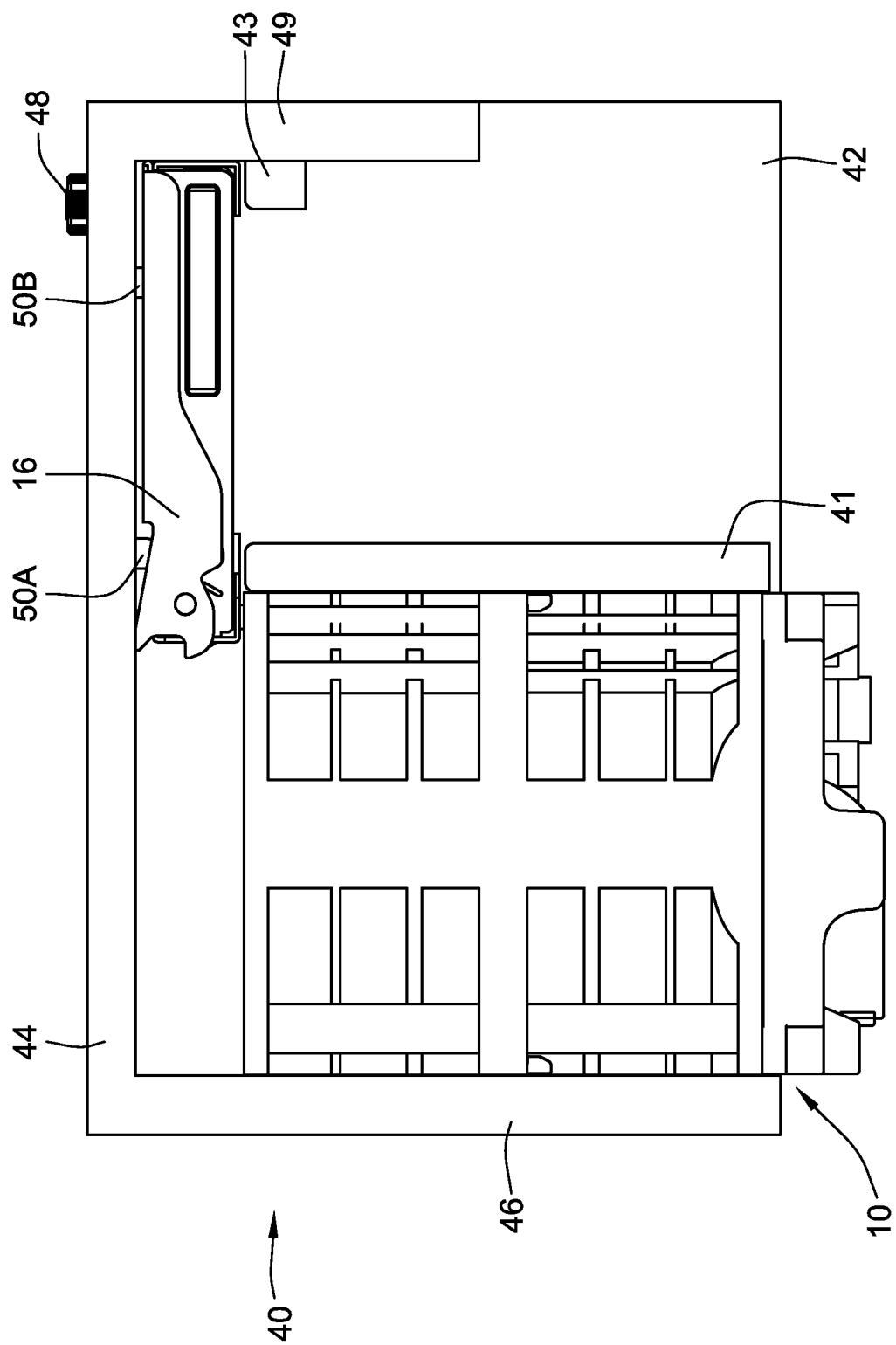
FIG. 6A is a top plan view of an assembly fixture for assembling the fan module of FIG. 1A and the elongated lens of FIG. 1B, according to some aspects of the present disclosure.
Figure 6B:
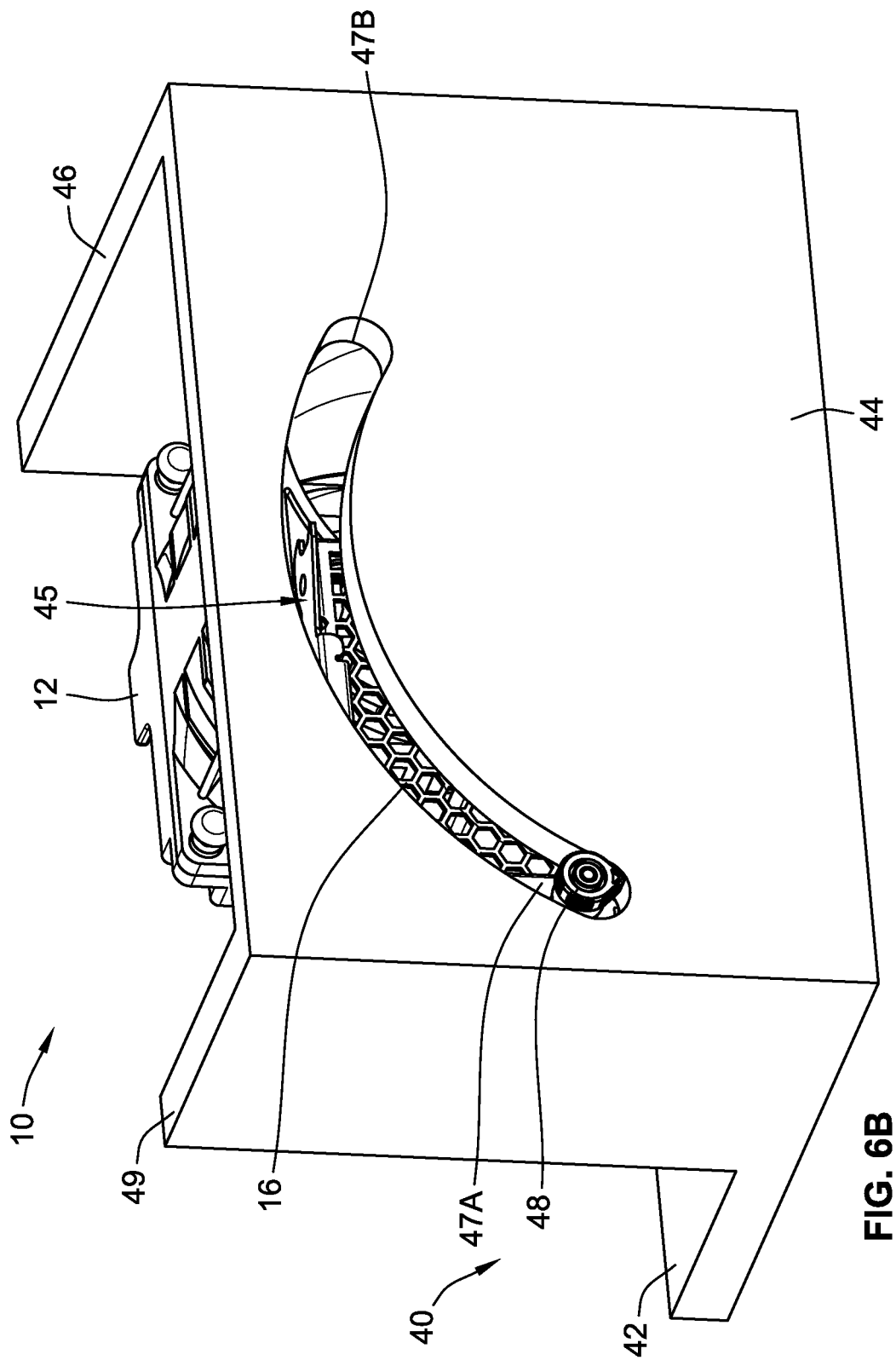
FIG. 6B is a perspective view of the assembly fixture of FIG. 6A, according to some aspects of the present disclosure.
Figure 6C:
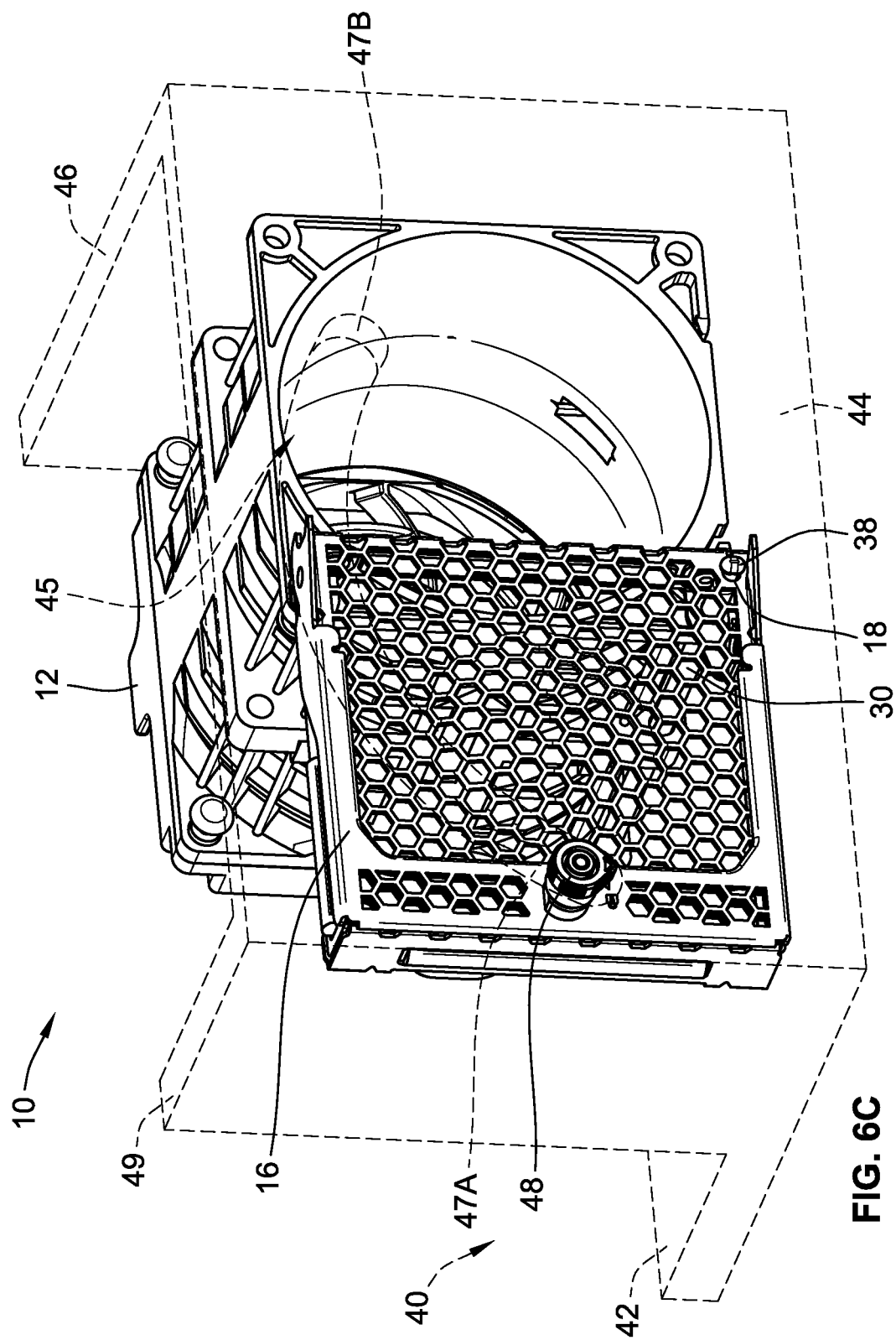
FIG. 6C is a partially transparent perspective view of the assembly fixture of FIG. 6A, according to some aspects of the present disclosure.

Referring now to FIGS. 6A-6C, an exemplary assembly fixture 40 is shown for facilitating assembly of the housing 12 and the cover plate 16. The assembly fixture 40 has a fixture body that generally includes a base plate 42, a first wall 44, a second wall 46, and a third wall 49. The first wall 44, the second wall 46, and the third wall 49 are coupled to edges of the base plate 42 and extend upwards at an angle of about 90 degrees. The second wall 46 and the third wall 49 are generally parallel to each other. The first wall 44 is positioned at an angle relative to both the second wall 46 and the third wall 49 of about 90 degrees. The assembly fixture 40 further includes a first alignment guide 41 extending from the base plate 42. The first alignment guide 41 is generally parallel with the second wall 46 and the third wall 49. The base plate 42, the first alignment guide 41, and the second wall 46 define a channel into which the fan module 10 may be placed during assembly.

The assembly fixture 40 also includes a second alignment guide 43 extending from the third wall 49 toward the second wall 46. The second alignment guide 43 is spaced apart a distance from the first wall 44 that is generally equal to a thickness of the cover plate 16. The first alignment guide 41 is also spaced apart from the first wall 44 a distance generally equal to the thickness of the cover plate 16. The base plate 42, the first wall 44, the third wall 49, the first alignment guide 41, and the second alignment guide 43 thereby define a space into which the cover plate 16 may be placed during assembly. When placed in the assembly fixture 40, the cover plate 16 extends a distance from the third wall 49 such that at least a portion of the cover plate 16 is positioned between the first wall 44 and the fan module 10. The fan module 10 is thus prevented from being placed flush against the first wall 44, but rather is spaced a distance apart from the first wall 44.

The assembly fixture 40 may also include further alignment guides. For example, the assembly fixture 40 may include one or more projections 50A and 50B extending from the first wall 44 that assist in positioning the cover plate 16 during the assembly process. A top view of the fan module 10 and the cover plate 16 when both are placed into the assembly fixture 40 is shown in FIG. 6A.

The assembly fixture 40 also includes a fixture opening. The fixture opening can have a circuitous shape, such as an arch. As shown in FIG. 6B, the fixture opening comprises an elongated aperture 45 that is defined in the first wall 44. The elongated aperture 45 has a first end 47A and a second end 47B. This elongated aperture 45 is sized so that a protuberance 48 coupled to the cover plate 16 can be inserted through the elongated aperture 45. The protuberance 48 can be removably coupled to the cover plate 16, or can be permanently coupled to the cover plate 16. To begin the assembly process, the cover plate 16 is placed against the first wall 44 in the orientation. In this orientation, the protuberance 48 extends through the elongated aperture 45 at the first end 47A of the elongated aperture 45. The protuberance 48 extends all the way through the elongated aperture 45 to the side of the first wall 44 opposite of the fan module 10. FIG. 6B shows a perspective view of the assembly fixture 40 to illustrate the protuberance 48 extending through the elongated aperture 45. FIG. 6C shows the assembly fixture 40 as transparent to better illustrate the relative position of the components from the front.

Figure 7A:
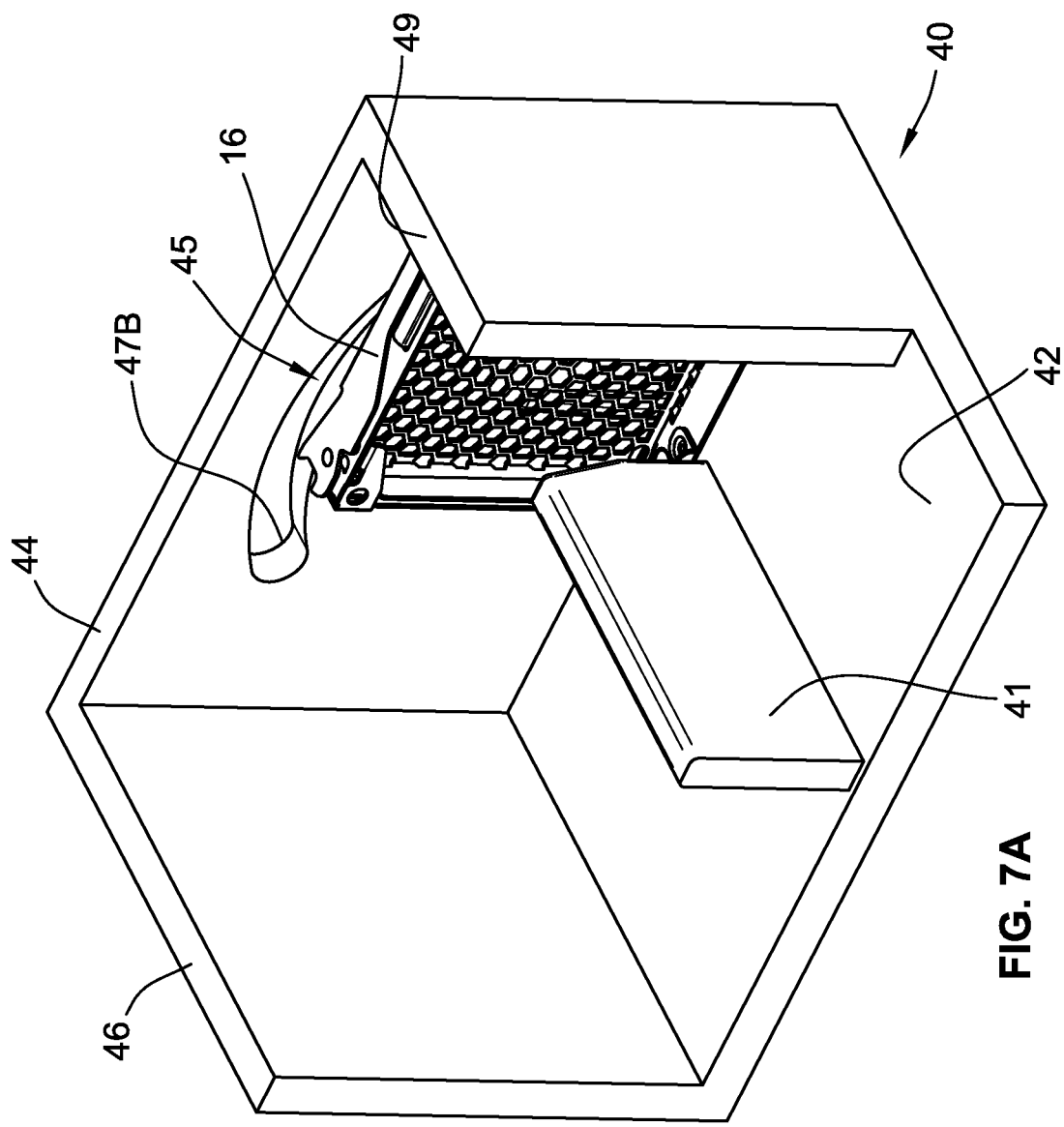
FIG. 7A is a perspective view of the cover plate of the fan module of FIG. 1A being placed into the assembly fixture of FIG. 6A in a first orientation, according to some aspects of the present disclosure.
Figure 7B:
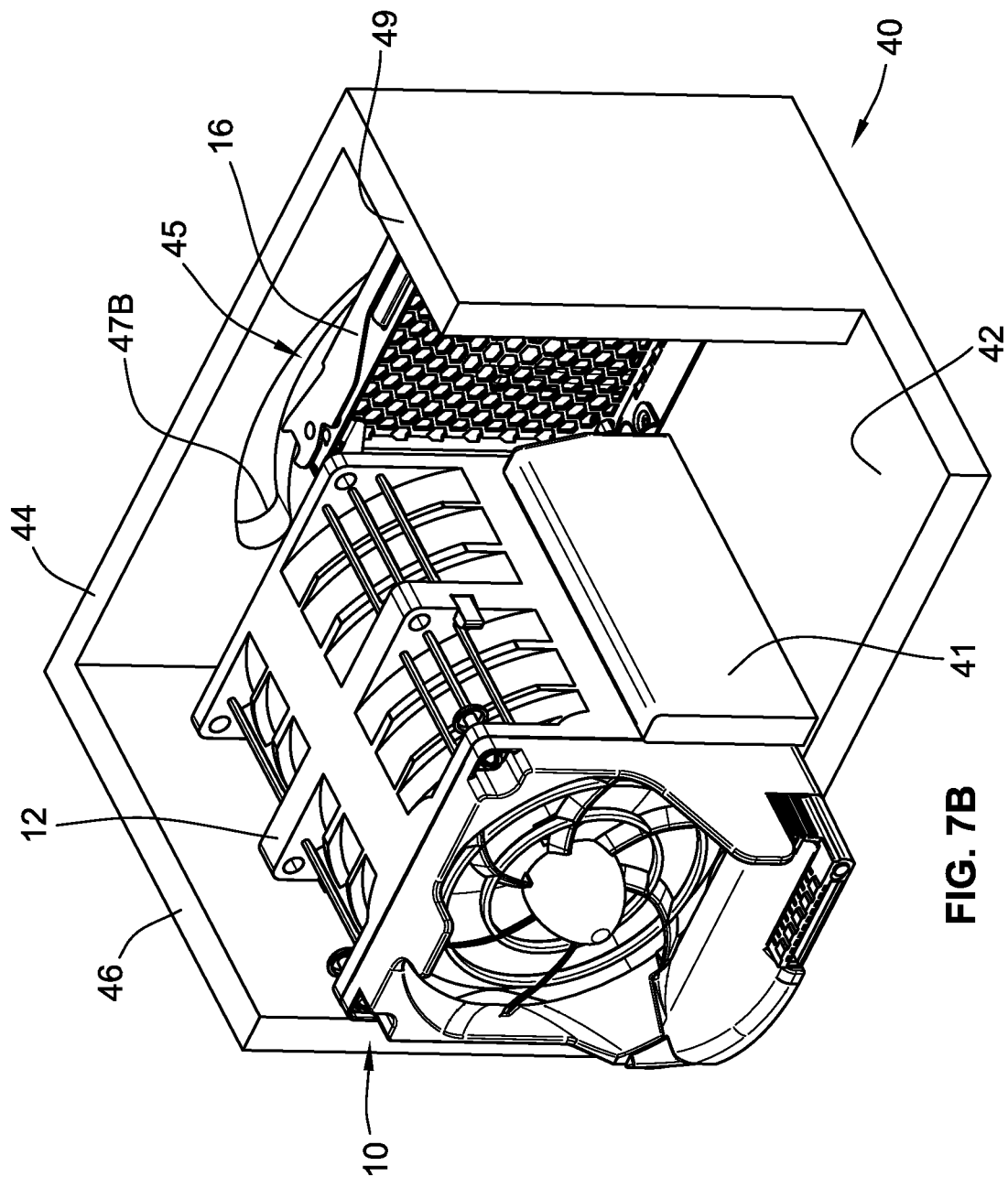
FIG. 7B is a perspective view of the housing of the fan module of FIG. 1A being placed into the assembly fixture of FIG. 6A, according to some aspects of the present disclosure.

FIGS. 7A-7D showing the process of assembling the fan module 10 and the cover plate 16 using the assembly fixture 40. First, as shown in FIG. 7A, the cover plate 16 can be placed into the assembly fixture 40. When the cover plate 16 is initially placed into the assembly fixture 40, the cover plate 16 is positioned in the first orientation, at an angle of about 90 degrees relative to its final position when coupled to the housing 12 of the fan module 10. After the elongated lens 30 has been integrated into the housing 12 (as shown in FIGS. 4A-4C and 5A-5D herein), the housing 12 can be placed into the assembly fixture 40 as shown in FIG. 7B. The housing 12 with the integrated elongated lens 30 is placed into the space of the assembly fixture 40 defined between the second wall 46 and the first alignment guide 41.

When the housing 12 is placed into the assembly fixture 40, the head portion of the elongated lens 30 extends past the second end 14B of the housing 12. The assembly fixture 40 is dimensioned such that the head portion of the elongated lens 30 is aligned with an aperture in the cover plate 16. Because the cover plate 16 is positioned in the first orientation, the large dimension of the head portion of the elongated lens 30 will be aligned with the large dimension of the aperture. Consequently, the head portion of the elongated lens 30 will be able to pass through the large dimension of the aperture in the cover plate. By placing the housing 12 into the assembly fixture 40 after placing the cover plate 16 into the assembly fixture 40, the head portion of the elongated lens 30 passes through the aperture in the cover plate 16.

As shown in FIG. 7C, the cover plate 16 can then be caused to rotate relative to the housing 12 by moving the protuberance 48 (FIGS. 6A-6C) in a curved path from the first end 47A of the elongated aperture 45 to the second end 47B of the elongated aperture 45. This movement causes the cover plate 16 to rotate about an axis that is generally coaxial with the elongated lens 30. The cover plate 16 is rotated until it is aligned with the housing 12, as shown in FIG. 7D. In FIG. 7D, the cover plate 16 is positioned in the second orientation. In the second orientation, the large dimension of the head portion of the elongated lens 30 is aligned with the small dimension of the aperture 18. Because of this alignment, the elongated lens 30 cannot be pulled back through the aperture in the cover plate 16.

The movement of the protuberance 48 also causes the fastener apertures in the housing 12 to align with the fastener apertures in the cover plate 16. Once in the second orientation, the fasteners can be inserted through the fastener apertures in the housing 12 and the cover plate 16 to secure the cover plate 16 to the housing 12, thereby locking rotation of the cover plate 16 relative to the head portion of the elongated lens 30. While FIG. 7D illustrates only two fasteners 22A and 22C, any number of fasteners can be used to secure the cover plate 16 to the housing 12.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An apparatus, comprising:
   a fan module including a housing and a cover plate coupled to an end of the housing, the cover plate having a plurality of apertures; and
   an elongated lens having a body portion and a head portion, the body portion including a radially-extending projection configured to lock rotation of the lens relative to the fan module,
   wherein a first one of the plurality of apertures and the head portion are dimensioned to permit the head portion to pass through the first one of the plurality of apertures responsive to the cover plate being positioned in a first orientation relative to the head portion, and to prevent the head portion from passing through the first one of the plurality of apertures responsive to the cover plate being positioned in a second orientation relative to the head portion, and wherein the cover plate is positioned at a first end of the housing, and the radially-extending projection of the lens is configured to be positioned at a second opposing end of the housing when the head portion passes through the first one of the plurality of apertures.

2. The apparatus of claim 1, wherein the head portion has a first oblong shape with a first dimension and a second dimension.

3. The apparatus of claim 2, wherein the first one of the plurality of apertures has a second oblong shape with a first dimension and a second dimension.

4. The apparatus of claim 3, wherein the first dimension of the first oblong shape is less than the first dimension of the second oblong shape and greater than the second dimension of second oblong shape, and wherein the second dimension of the first oblong shape is less than the second dimension of second oblong shape.

5. The apparatus of claim 2, wherein the oblong shape of the head portion is an oval shape, a rectilinear shape, a rectangular shape, an elliptical shape, a diamond shape, or any combination thereof.

6. The apparatus of claim 1, wherein the second orientation of the cover plate is rotated about 90 degrees relative to the first orientation of the cover plate.

7. The apparatus of claim 1, wherein when the cover plate is positioned in the first orientation relative to the head portion, the first dimension of the head portion is aligned with the first dimension of the first one of the plurality of apertures.

8. The apparatus of claim 7, wherein when the cover plate is positioned in the second orientation relative to the head portion, the first dimension of the head portion is aligned with the second dimension of the first one of the plurality of apertures.

9. The apparatus of claim 1, wherein at least a portion of the elongated lens is coupled to the housing of the fan module, and wherein the head portion of the elongated lens extends from the housing of the fan module in a first direction.

10. The apparatus of claim 9, further comprising at least one fastener configured to extend through at least one housing fastener aperture defined by the housing of the fan module and a corresponding at least one cover plate fastener aperture defined by the cover plate, the at least one fastener configured to lock the cover plate in the second orientation.

11. The apparatus of claim 10, wherein the at least one fastener includes a first fastener, a second fastener, and a third fastener, wherein the at least one housing fastener aperture includes a first housing fastener aperture, a second housing fastener aperture, and a third housing fastener aperture, and wherein the at least one cover plate fastener aperture includes a first cover plate fastener aperture, a second cover plate fastener aperture, and a third cover plate fastener aperture.

12. The apparatus of claim 1, wherein the elongated lens has a neck portion positioned between the body portion and the head portion, the body portion having a first diameter and the neck portion having a second diameter that is less than the first diameter.

13. The apparatus of claim 12, wherein the first dimension of the head portion is equal to the first diameter of the body portion, and wherein the second dimension of the head portion is equal to the second diameter of the neck portion.

14. The apparatus of claim 12, wherein the first diameter of the body portion is greater than the second dimension of the first one of the plurality of apertures.

15. The apparatus of claim 12, wherein the second diameter of the neck portion is less than or equal to the second dimension of the first one of the plurality of apertures.

16. The apparatus of claim 1, wherein the cover plate includes a protuberance that is removably attached to the cover plate.

17. An assembly fixture for assembling the apparatus of claim 16, comprising a fixture body configured to receive the housing and the cover plate, the fixture body defining a fixture opening to receive the protuberance in the first orientation or the second orientation, wherein movement of the protuberance within the fixture opening rotates the cover plate relative to the head portion.

18. The assembly fixture of claim 17, wherein the fixture opening comprises arched shape.

19. The apparatus of claim 1, wherein the radially-extending projection locks axial movement of the lens relative to the first one of the plurality of apertures.

20. The apparatus of claim 19, wherein the radially-extending projection locks axial movement of the lens in only a first axial direction, and wherein the head portion locks axial movement of the lens in only a second opposing axial direction responsive to the cover plate being position in the second orientation relative to the head portion.

* * * * *